US010521133B2

(12) United States Patent
Wang et al.

(10) Patent No.: US 10,521,133 B2
(45) Date of Patent: Dec. 31, 2019

(54) METHOD AND APPARATUS FOR REAL-TIME BLANK PAGE DETECTION IN DATA TRANSMISSION (71) Applicant: FREESCALE SEMICONDUCTOR, INC., Austin, TX (US)

(72) Inventors: Yong Wang, Shanghai (CN); Chongbin Fan, Shanghai (CN); Jun Xie, Shanghai (CN)

(73) Assignee: NXP USA, INC., Austin, TX (US)

( * ) Notice: Subject to any disclaimer, the term of this patent is extended or adjusted under 35 U.S.C. 154(b) by 159 days.

(21) Appl. No.: 14/946,780

(22) Filed: Nov. 20, 2015

(65) Prior Publication Data

US 2016/0328164 A1 Nov. 10, 2016
US 2018/0039432 A9 Feb. 8, 2018

(30) Foreign Application Priority Data

Jun. 10, 2015 (CN) .......................... 2015 1 0445431

(51) Int. Cl.
G06F 3/06 (2006.01)
G11C 29/52 (2006.01)
G11C 29/50 (2006.01)
G06F 11/10 (2006.01)

(52) U.S. Cl.
CPC .......... G06F 3/0619 (2013.01); G06F 3/0635 (2013.01); G06F 3/0653 (2013.01); G06F 3/0688 (2013.01); G06F 11/1096 (2013.01); G11C 29/50004 (2013.01); G11C 29/52 (2013.01); G11C 2029/5004 (2013.01)

(58) Field of Classification Search
None
See application file for complete search history.

(56) References Cited

U.S. PATENT DOCUMENTS

| 5,930,706 | A | 7/1999 | Raith |
| 7,751,071 | B2 | 7/2010 | Namizuka |
| 8,351,290 | B1* | 1/2013 | Huang ................. G11C 16/349 365/218 |
| 8,417,879 | B2 | 4/2013 | Chen |
| 8,488,155 | B2 | 7/2013 | Maruyama |
| 8,854,641 | B2 | 10/2014 | Hirohata |
| 2008/0151618 | A1 | 6/2008 | Sharon |
| 2011/0040928 | A1* | 2/2011 | Kuo .................... G06F 11/1068 711/103 |
| 2012/0110241 | A1 | 5/2012 | Lam |
| 2012/0154853 | A1 | 6/2012 | Otake |
| 2013/0238876 | A1* | 9/2013 | Fiske .................... G06F 3/0641 711/216 |

(Continued)

Primary Examiner — Edward J Dudek, Jr.
Assistant Examiner — Ralph A Verderamo, III (57) ABSTRACT A device for reading data from a first memory to a second memory based on real-time blank page detection includes a memory controller for reading a page of data from the first memory, a buffer for buffering a portion of the page data, a blank page pre-detection unit for generating a pre-detection result that indicates whether the page is a blank page based on a pre-determined part of the page data, a data processing unit for processing all of the page data to identify a page type, and a control unit for signaling the memory controller to read the page of data from the first memory and enabling the data processing unit based on the pre-detection result.

14 Claims, 5 Drawing Sheets (56) References Cited

U.S. PATENT DOCUMENTS

2014/0226404 A1* 8/2014 Lee .................. G11C 16/16
  365/185.11
2014/0359345 A1* 12/2014 Chen ................ G11C 16/349
  714/6.11

* cited by examiner

METHOD AND APPARATUS FOR REAL-TIME BLANK PAGE DETECTION IN DATA TRANSMISSION

BACKGROUND OF THE INVENTION

The present invention relates to a method and an apparatus for transferring data between different memories and, more particularly, to real-time blank page detection of data read from a memory.

Figure 1:
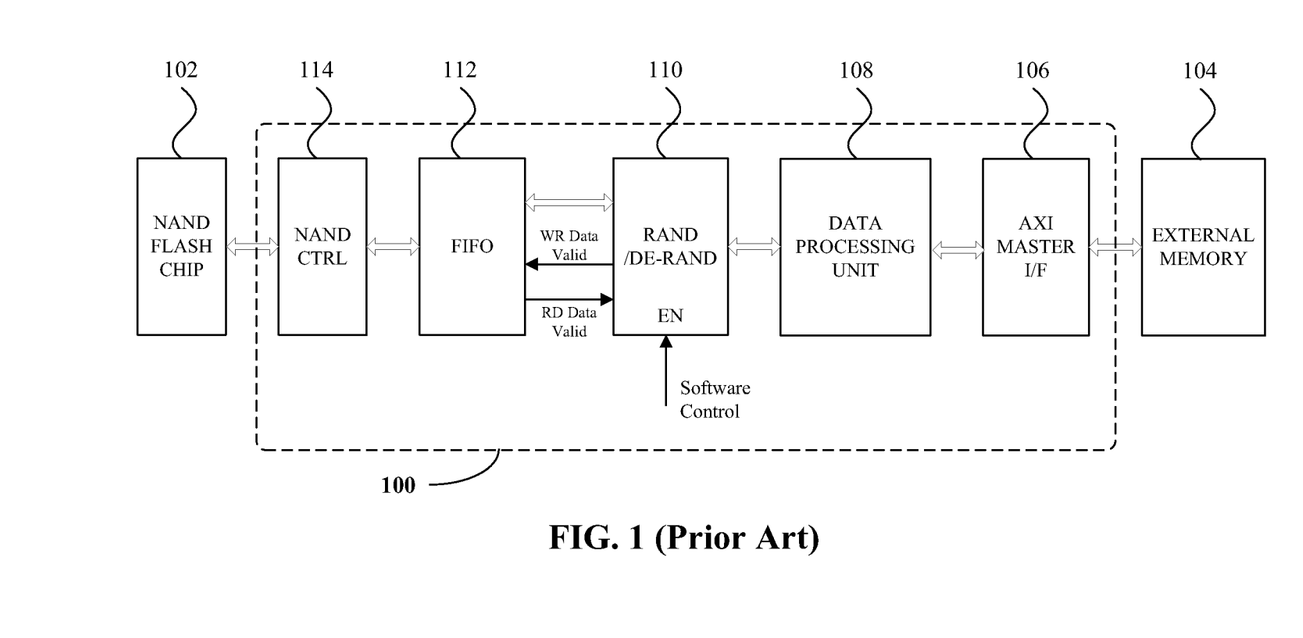
FIG. 1 is a schematic block diagram of a conventional device for transmitting data between a first memory and a second memory.

FIG. 1 shows a conventional device 100 for transferring data between a flash memory 102 and an external memory 104. The flash memory 102 can be any type of memory that contains information (data) stored in units of programmed pages, and the external memory 104 can be either on or off-chip random access memory (RAM). The device 100 is used to transfer data between low cost, page-based flash memory 102 and high cost, RAM (the external memory 104). Due to the high possibility of errors either programming or reading from the flash memory 102, the device 100, in general, implements enhanced algorithms to recover from these errors. When being programmed from the external memory 104 to the flash memory 102 by the device 100, the data sequentially passes an interface 106 of the device 100, a data processing unit 108 that encodes the data with a set of codes, a randomizer/de-randomizer 110 that randomizes the data to combat noise, and a buffer 112 that buffers a portion of the encoded, randomized data before being programmed into the flash memory 102 with a memory controller 114. A programmed page stored in the flash memory 102 usually contains equivalently distributed "0" and "1" bits due to the randomization. The buffer, which is implemented by registers, usually has a small memory size such as several 32-bit words to save area. The flash memory 102 stores the data page-by-page. Thus, when reading a page of data from the flash memory 102 with the device 100, the page of data also sequentially passes the memory controller 114 for reading the page of data from the flash memory 102, the buffer 112 for buffering a portion of the page of data, the randomizer/de-randomizer 110 for de-randomizing the page of data, and the data processing unit 108 for decoding the de-randomized page of data that has already flowed out of the device 100 and storing in the external memory 104 while actual error locations are calculated some time later due to the complexity of the calculations. The set of codes used for encoding and decoding are error-correcting codes (ECC), such as BCH codes. Therefore, the decoded data stored in the external memory 104 will reflow to the data processing unit 108 for error correcting.

In addition to a plurality of programmed pages with programmed data, the flash memory 102 may include some blank pages that contain only "0xFF" bytes, and some bad pages that cannot be programmed properly. Some of the bad pages have been previously detected and marked during manufacturing, while some of the bad pages are transformed from good pages over time due to progressive deterioration. As the randomization and de-randomization are performed by XORing the data with a random sequence generated by the randomizer/de-randomizer 110, a de-randomized blank page will contain non-0xFF bytes, therefore, when a portion of the page of data fails in the error correcting process after being de-randomized, the page of data must be re-read from the flash memory 102, and transferred to the data processing unit 108 skipping de-randomization for whole-page blank page detection. The data processing unit 108 detects whether the page of data is a blank page by scanning the whole page.

However, rereading the page of data from the flash memory 102 for blank page detection is time consuming, and when a blank page is found, the external memory 104 already contains at least a part of the data of the blank page that has been previously de-randomized and decoded. Thus filling the external memory 104 with 0xFF bytes to clear the part of data of the de-randomized and decoded blank page also takes time. It is therefore desirable to find a method for real-time blank page detection to reduce the data transmission time.

BRIEF DESCRIPTION OF THE DRAWINGS

The invention, together with objects and advantages thereof, may best be understood by reference to the following description of preferred embodiments together with the accompanying drawings in which.

DETAILED DESCRIPTION OF PREFERRED EMBODIMENTS

The detailed description set forth below in connection with the appended drawings is intended as a description of presently preferred embodiments of the invention, and is not intended to represent the only forms in which the present invention may be practised. It is to be understood that the same or equivalent functions may be accomplished by different embodiments that are intended to be encompassed within the spirit and scope of the invention. In the drawings, like numerals are used to indicate like elements throughout. Furthermore, terms "comprises," "comprising," or any other variation thereof, are intended to cover a non-exclusive inclusion, such that module, circuit, device components, structures and method steps that comprises a list of elements or steps does not include only those elements but may include other elements or steps not expressly listed or inherent to such module, circuit, device components or steps. An element or step proceeded by "comprises . . . a" does not, without more constraints, preclude the existence of additional identical elements or steps that comprises the element or step.

In one embodiment, the present invention provides a device for reading data from a first memory to a second memory. The device includes a memory controller for reading at least one page of data from the first memory, a buffer connected to the memory controller for buffering a portion of the at least one page of data read from the first memory, a blank page pre-detection unit, connected to the buffer, for generating a pre-detection result that indicates whether the at least one page is a blank page based on a pre-determined part of the data in the at least one page, a data processing unit, connected to the buffer and the blank page pre-detection unit, for processing all of the data in the at least one page to identify a type of the page, and a control unit, connected to the memory controller, the blank page pre-detection unit, and the data processing unit, for signaling the memory controller to read the at least one page of data from the first memory and enabling the data processing unit based on the pre-detection result.

In another embodiment, the present invention provides a method of reading data from a first memory to a second memory performed by a device, wherein the device includes a buffer and a processor connected to the buffer. The method includes reading at least one page of data from the first memory, generating a pre-detection result that indicates whether the at least one page is a blank page based on a pre-determined part of the at least one page of data stored in the buffer, performing blank page detection based on all of the data in the at least one page if the pre-detection result indicates that the at least one page is a blank page, and de-randomizing and decoding the at least one page of data if the pre-detection result or the blank page detection indicates that the at least one page is not a blank page.

Figure 2:
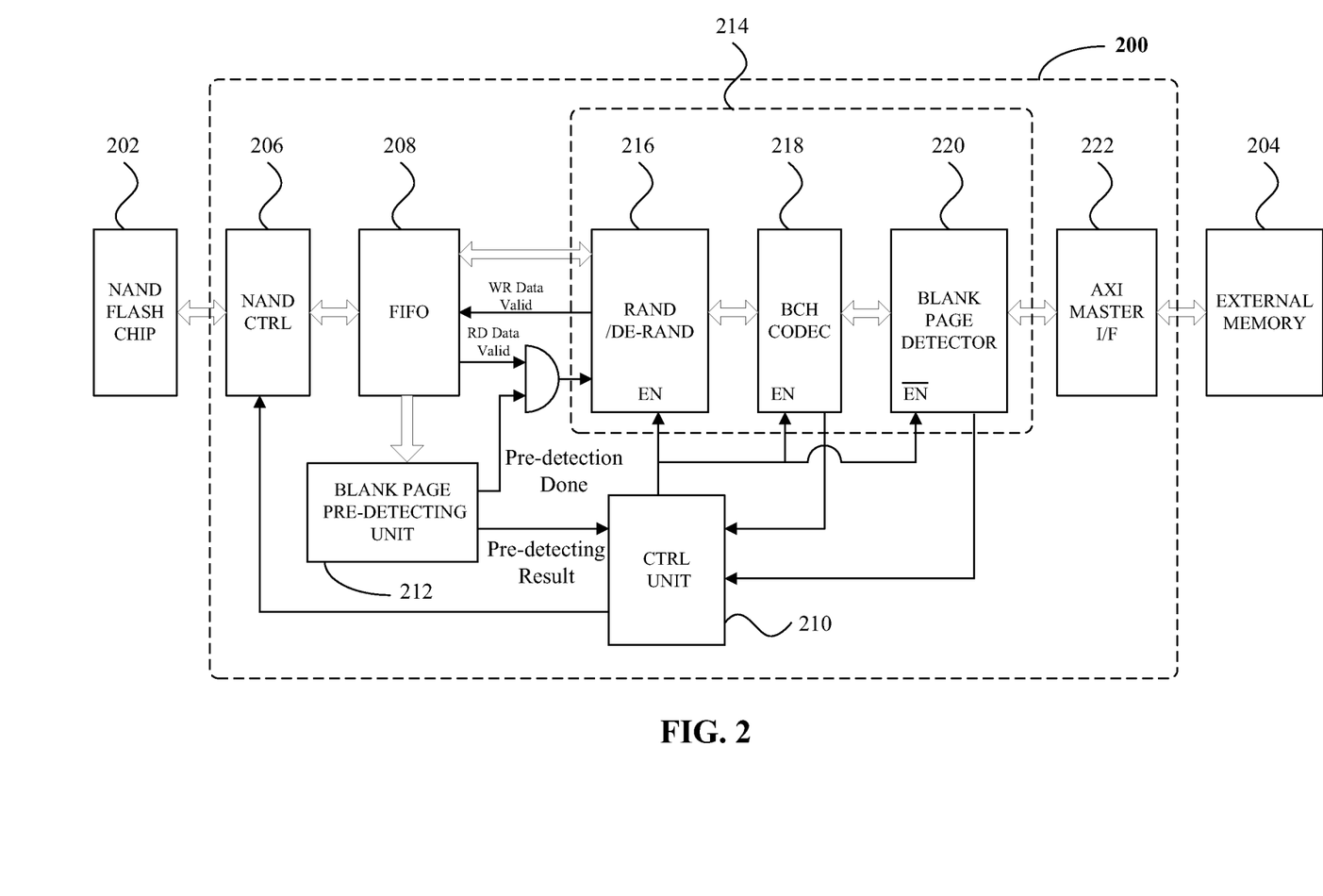
FIG. 2 is a schematic block diagram of a device for transmitting data between a first memory and a second memory in accordance with an embodiment of the invention.

Referring now to FIG. 2, a block diagram of a device 200 for transferring data between a first memory 202 and a second memory 204 in accordance with an embodiment of the invention is shown. The device 200 can be implemented in hardware or software, the flash memory 202 can be any low cost, page-based accessible memory chip that stores a programmed pages, and the external memory 204 can be any higher cost, on or off-chip RAM. The device 200 includes a memory controller 206 for reading at least one page of data from the first memory 202, a buffer 208 connected to the memory controller 206 for buffering a portion of the at least one page of data read from the first memory 202, and a control unit 210 connected to the memory controller 206 for signaling the memory controller 206 to read the at least one page of data from the first memory 202. The buffer 208 is preferably a first-in-first-out (FIFO) buffer with a small memory size such as several 32-bit words. In a preferred embodiment, the memory controller 206 reads the at least one page of data from the first memory 202 based on a set of threshold voltage configurations for the first memory provided by the control unit 210. The set of threshold voltage configurations includes at least one threshold voltage configuration indicating a mapping between logic values and corresponding voltage ranges inside a single information storage cell of the first memory.

The device 200 further includes a blank page pre-detection unit 212, connected to the buffer 208, for generating a pre-detection result that indicates whether the at least one page is a blank page based on a pre-determined part of the data in the at least one page, and a data processing unit 214, connected to the buffer 208, the control unit 210 and the blank page pre-detection unit 212, for identifying a type of the page based on all of the data in the at least one page. Operation of the data processing unit 214 is controlled by the control unit 210 based on the pre-detection result.

Figure 3:
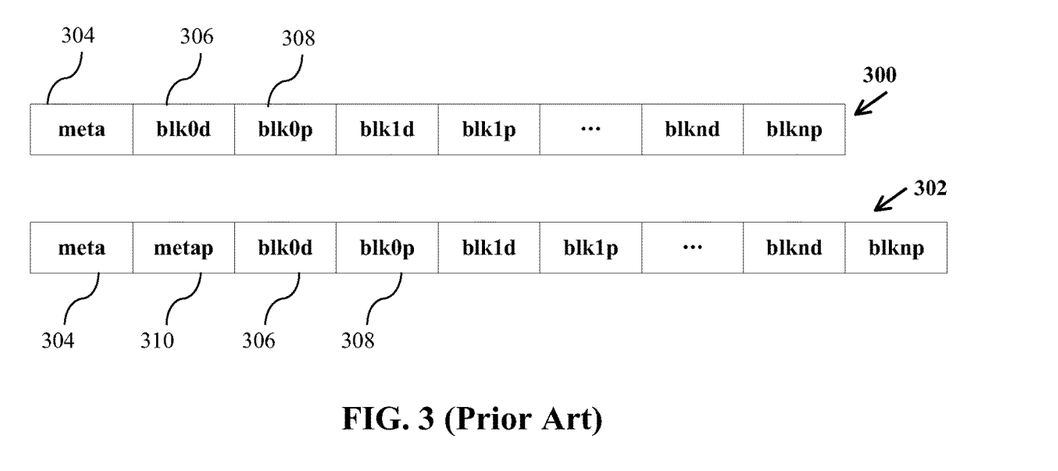
FIG. 3 shows two types of data structures of a page in the first memory.

FIG. 3 shows first and second structure types 300 and 302 of a page in the first memory 202. In a page having the first data structure type 300, the page of data includes a metadata block 304 at the beginning of the page that stores information of the page, such as bad page indication or some bytes swapped for bad page indication or other control bytes, followed by a plurality of interlaced block[n]d blocks 306 for storing a systematic part of the ECC code used for decoding and encoding and block[n]p blocks 308 for storing a parity part of the ECC code for corresponding block[n]d blocks 306. In a page having the second data structure type 302, the page of data includes a metadata block 304 that stores information of the page and a meta data block 310 that stores the parity part of the ECC for the meta data block, followed by a plurality of interlaced block[n]d blocks 306 for storing the systematic part of the ECC and block[n]p blocks 308 for storing the parity part of the ECC code for block[n]d block. In a preferred embodiment, the predetermined part used for blank page pre-detection is the metadata block 304 of the page.

Figure 4:
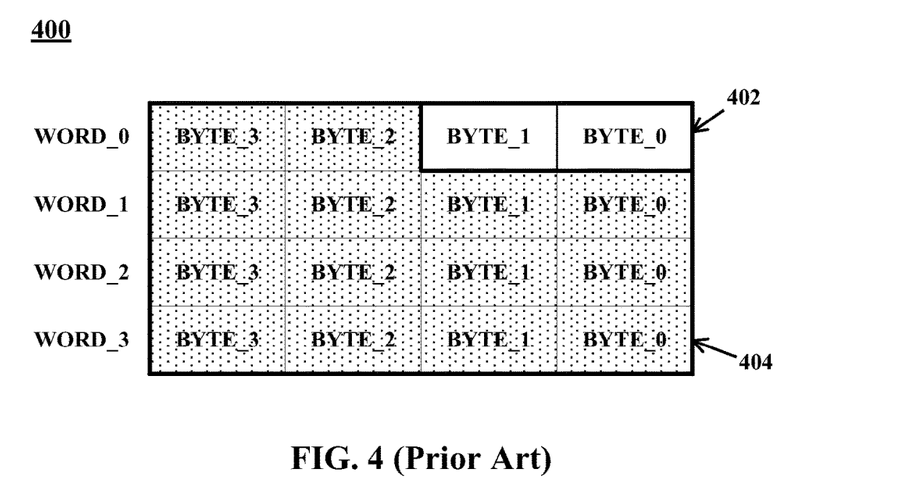
FIG. 4 shows a structure of a metadata block in the memory page.

FIG. 4 shows a detailed structure of a metadata block 400 of a page with one of the structure types 300 and 302. A size of the metadata block 400 is configured to be 128 bits that includes 4 words WORD_0~WORD_3. As shown in FIG. 4, the metadata block 400 has an occupied part 402 with a size of at least one byte for containing the information of the page, and a non-occupied part 404. In the example shown in FIG. 4, the occupied part 402 is the first two bytes BYTE_0 and BYTE_1 of the first word WORD_0, and the non-occupied part 404 has a size of 112 bits that includes 14 bytes. For a programmed page, the non-occupied part 404 is filled with 0x00 bytes. However, if the page is a blank page, the non-occupied part 404 is ideally filled with 0xFF bytes, or only contains a limited number of "0" bits due to noise.

Referring back to FIG. 2, the blank page pre-detection unit 212 generates the pre-detection result by counting one of "1" and "0" bits in the non-occupied part 404 and comparing the number of one of "1" and "0" in the non-occupied part 404 with a predetermined threshold. The predetermined threshold is preferably set as half of the number of bits in the non-occupied part 404. For example, the blank page pre-detection unit 212 counts 1 in the non-occupied part 404, and the predetermined threshold is set as 56, which is half of the number of bits in the non-occupied part 404 for the metadata block 400 of FIG. 4. The blank page pre-detection unit 212 pre-detects the page is a blank page if the number of "1" bits in the non-occupied part 404 is greater than the predetermined threshold. In a preferred embodiment, the blank page pre-detection unit 212 generates a pre-detection-done signal in conjunction with a read data valid signal generated by the buffer 208 for indicating the data processing unit 214 to read data from the buffer 208, and further indicates the pre-detection result to the control unit 210.

The data processing unit 214 includes a de-randomizer 216, a decoder 218 and a blank page detector 220, which are respectively enabled by the control unit 210 based on the pre-detection result.

If the pre-detection result indicates that the page is a blank page, the control unit 210 disables the de-randomizer 216 and the decoder 218, and enables the blank page detector 220 for double checking whether the page is a blank page by scanning all of the data in the page to generate a final blank page detecting result. The page is skipped if the final blank page detecting result shows that the page is a blank page.

If either the pre-detection result or the final blank page detecting result shows that the page is not a blank page, the control unit 210 enables the de-randomizer 216 and the decoder 218, and disables the blank page detector 220 for further processing. In a preferred embodiment, if the pre-detection result indicates that the page is not a blank page, the de-randomizer 216 de-randomizes data in the page preferably by XORing the data with a random sequence generated by the de-randomizer 216, and the decoder 218 decodes the de-randomized data in the page with a set of codes and performs error-correcting process on the decoded data, where the set of codes belongs to a class of cyclic error-correcting codes, such as BCH codes. If the final blank page detecting result shows that the page is not a blank page, a read-retry operation will be performed, in which the control unit 210 signals the memory controller 206 to read the page of data from the first memory 202 again based on a second set of threshold voltage configurations, and the data processing unit 214 de-randomizes and decodes the data in the page read based on the second set of threshold voltage configurations. Similarly, if errors in the decoded data of the page fail to be corrected, another read-retry operation will be performed based on another set of threshold voltage configurations. In a preferred embodiment, the control units 210 includes a plurality of sets of threshold voltage configurations.

If the page of data passes the decoding and error-correcting process based on one set of threshold voltage configurations, the page is a programmed page and the decoded data is stored in the external memory 204 through an interface 222. In a preferred embodiment, the interface 222 is a master interface for accessing the second memory, such as AXI protocol used by ARM Corporation. However, if the page of data read from the flash memory 202 fails in the error-correcting process after all of the plurality of sets of threshold voltages have been tried, the page is identified as a bad page and will be skipped.

Figure 5:
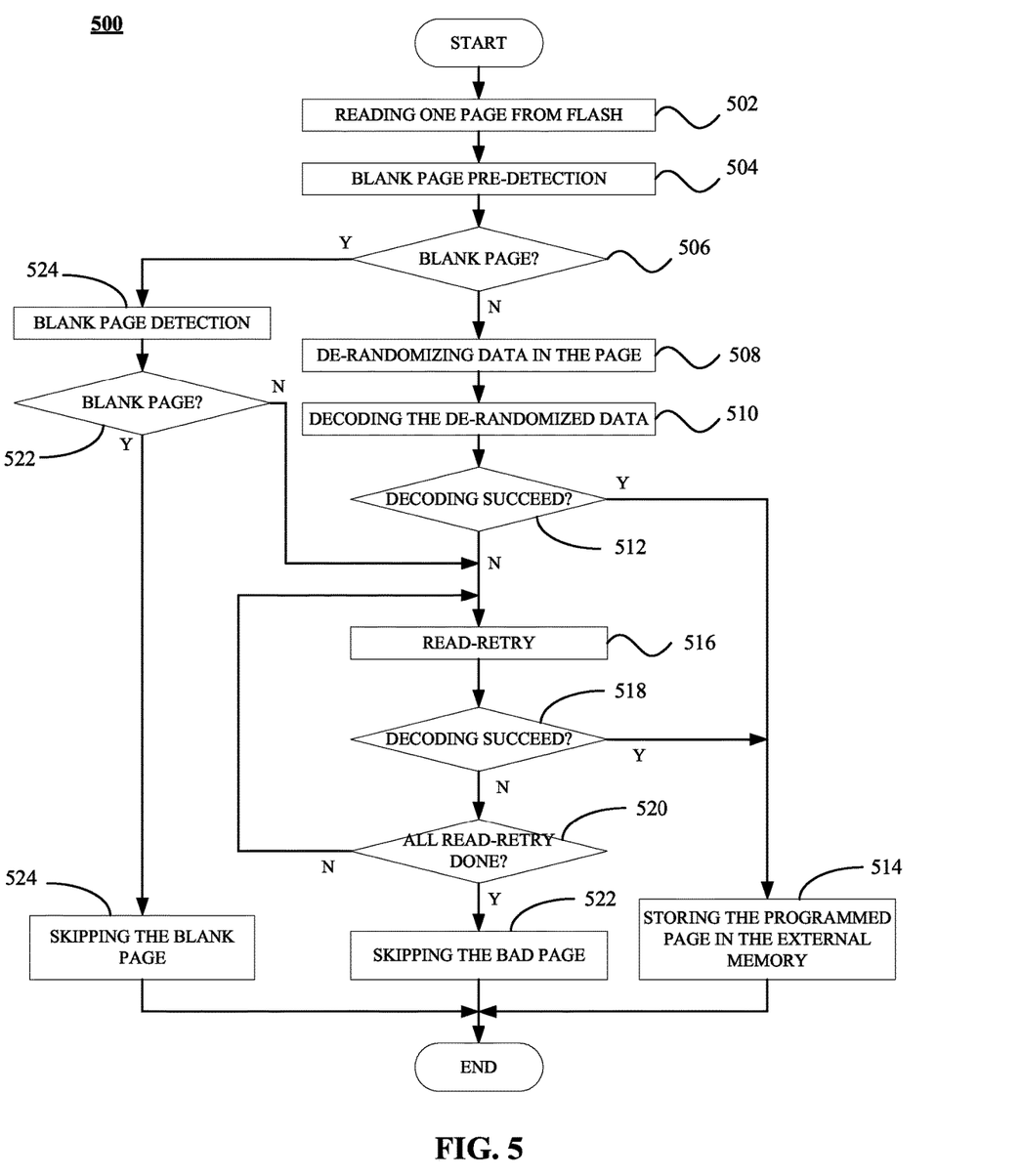
FIG. 5 is a flow chart of a method for reading data from the first memory with the device of FIG. 2 in accordance with another embodiment of the invention.

FIG. 5 is a flow chart of a method for operating the device 200 of FIG. 2 to read data from the first memory 202 to the external memory 204 in accordance with another embodiment of the invention. The device 200 can be implemented in hardware or software, the flash memory 202 can be any low cost, page-based accessible memory chip that stores a plurality of programmed data, and the external memory 204 can be any higher cost on or off-chip RAM.

At step 502, the memory controller 206 of the device 202 reads a page of data from the flash memory 202. In a preferred embodiment, the memory controller 206 reads the at least one page of data from the first memory 202 based on a set of threshold voltage configurations. The set of threshold voltage configurations includes at least one threshold voltage configuration indicating a mapping between logic values and corresponding voltage ranges inside a single information storage cell of the first memory. In a preferred embodiment, a portion of the data in the page that has been read out by the memory controller 206 is stored in the buffer 208 before being forwarded to a next step. The buffer 208 is preferably a FIFO buffer with a small memory size such as several 32-bit words implemented by registers.

At step 504, a blank page pre-detection process is performed to detect whether the page is a blank page based on a pre-determined part of the data in the page stored in the buffer 208. In a preferred embodiment, the predetermined part used for blank page pre-detection is the metadata block 304 at the beginning of the page, as shown in FIG. 3, for storing information of the page, such as bad page indication or some bytes swapped for bad page indication or other control bytes. As shown in FIG. 4, the metadata block 400 has an occupied part 402 with a size of at least one byte for containing the information of the page, and a non-occupied part 404. For a programmed page, the non-occupied part 404 is filled with 0x00 bytes. However, if the page is a blank page, the non-occupied part 404 is ideally filled with 0xFF bytes, or only contains a limited number of 0 bits due to noise.

In a preferred embodiment, the blank page pre-detection is performed by calculating one of "1 and 0 in the non-occupied part 404 and comparing the number of one of "1" and "0" in the non-occupied part 404 with a predetermined threshold. The predetermined threshold is preferably set as half of the number of bits in the non-occupied part 404. For example, if the number of "1" bits is greater than half of the number of bits in the non-occupied part 404, the page is pre-detected as a blank page, otherwise, the page is pre-detected as a non-blank page.

At step 506, if the page is pre-detected as a non-blank page, at steps 508 and 510, the data in the page is de-randomized preferably by being XORed with a random sequence, and decoded based on a set of codes. In a preferred embodiment, the decoding includes error-correcting the decoded data, where the set of codes belongs to a class of cyclic error-correcting codes, such as BCH codes.

At step 512, if the decoding succeeds, i.e., errors, if any, during the decoding have been corrected, at step 514, the page is identified as a programmed page, and the de-randomized and decoded data of the page is stored in the external memory 204. However, if the decoding fails, i.e., some errors during the decoding fails to be corrected, at step 516, a read-retry operation is performed.

Figure 6:
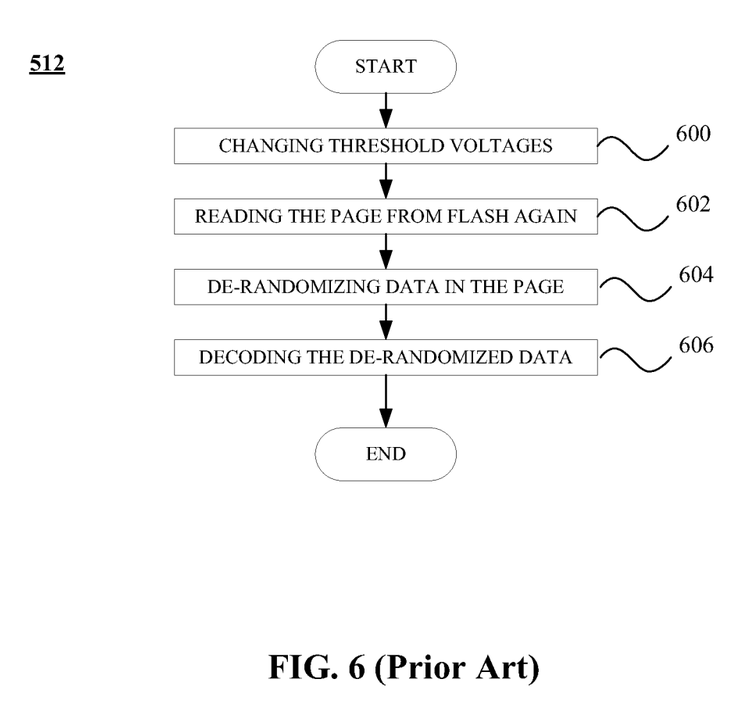
FIG. 6 is a flow chart of the read-retry step in the flow chart of FIG. 5.

FIG. 6 is a detailed flow chart of the read-retry operation 516 in the flow chart of FIG. 5.

At step 600, the set of threshold voltage configurations used for reading the page of data from the memory 202 is replaced with a second set of threshold voltage configurations.

At step 602, the memory controller 206 reads the page of data from the first memory 202 based on the second set of threshold voltage configurations.

At steps 604 and 606, the page of data is de-randomized preferably by being XORed with a random sequence and decoded with the set of ECC codes.

Going back to FIG. 5, at step 518, if the data of the page read based on the second set of threshold voltage configurations is successfully decoded, at step 514, the page is identified as a programmed page, and the de-randomized and decoded data of the page read based on the second set of threshold voltage configurations is stored in the external memory 204. Otherwise, at step 520, the read-retry operation is repeated based on other available sets of threshold voltage configurations. At step 522, if the page of data read from the flash memory 202 fails to be successfully decoded after all available sets of threshold voltage configurations have been tried, the page is identified as a bad page and will be skipped.

Referring back to step 506, if the page is pre-detected as a blank page, moving to step 522, blank page detection is performed by scanning through all of the data in the page.

At step 522, if the page is detected as a blank page based on the blank page detection process, at step 524, the blank page is skipped. If the page is detected as a non-blank page based on the blank page detection process, moving to step 516, the read-retry operation will be performed as described above until either the data in the page is successfully decoded and stored in the external memory 204 or the page is identified as a bad page and skipped.

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiment disclosed, but covers modifications within the spirit and scope of the present invention as defined by the appended claims.

The invention claimed is:

1. A device for reading data from a first memory to a second memory, the device comprising:
   a memory controller for reading at least one page of data from the first memory;
   a buffer connected to the memory controller for buffering a portion of the at least one page of data read from the first memory;
   a blank page pre-detection unit, connected to the buffer, for generating a pre-detection result that indicates whether the at least one page is a blank page based on a metadata block of the at least one page and for generating a pre-detection-done signal in response to generating of the pre-detection result, wherein the metadata block includes a first part for storing information for the at least one page, wherein the information indicates whether the at least one page is a bad page, and a second part for generating the pre-detection result, wherein the blank page pre-detection unit generates the pre-detection result by counting a number of 1s and 0s in the second part and comparing the number of 1s and 0s with a predetermined threshold;
   a data processing unit, connected to the buffer and the blank page pre-detection unit, for receiving the pre-detection-done signal from the blank page pre-detection unit, and in response to the receiving of the pre-detection-done signal, for processing all of the data in the at least one page to identify the at least one page as one of a plurality of types of pages, wherein the types of pages includes a programmed page and the bad page; and
   a control unit, connected to the memory controller, the blank page pre-detection unit, and the data processing unit, for signaling the memory controller to read the at least one page of data from the first memory and enabling the data processing unit based on the pre-detection result.

2. The device of claim 1, wherein the predetermined threshold is set as half of the number of bits in the non-occupied part.

3. The device of claim 1, wherein the data processing unit comprises:
   a blank page detector for detecting whether the at least one page is a blank page based on all of the data in the at least one page, wherein the blank page detector is enabled if the pre-detection result indicates that the at least one page is a blank page;
   a de-randomizer for de-randomizing the at least one page of data; and
   a decoder, connected to the de-randomizer, for identifying whether the at least one page is either of the programmed page or the bad page by decoding de-randomized data in the at least one page,
   wherein the de-randomizer and the decoder are enabled and the blank page detector is disabled if either of the pre-detection result or the blank page detector indicates that the at least one page is not a blank page.

4. The device of claim 3, further comprising an interface unit, connected to a page identifying unit, for transferring the at least one page of data to the second memory if the page identifying unit identifies that the at least one page is the programmed page, wherein the programmed page is identified if the decoder successfully decoded the de-randomized data in the at least one page.

5. The device of claim 3, wherein the memory controller reads the at least one page of data from the first memory based on a set of threshold voltage configurations provided by the control unit, wherein the set of threshold voltages includes at least one threshold voltage configuration indicating a mapping between logic values and corresponding voltage ranges inside a single information storage cell of the first memory.

6. The device of claim 5, wherein the control unit stores a plurality of sets of threshold voltage configurations, wherein upon a failure to decode the at least one page of data read based on a first set of threshold voltage configurations, the control unit enables the memory controller, de-randomizer and decoder to perform a read-retry operation based on a second set of threshold voltage configurations.

7. The device of claim 6, wherein in the read-retry operation, the memory controller reads the at least one page of data from the first memory based on the second set of threshold voltage configurations, the de-randomizer de-randomizes the at least one page of data read based on the second set of threshold voltages, and the decoder decodes the at least one page of data read based on the second set of threshold voltage configurations.

8. The device of claim 6, wherein the control unit indicates that the at least one page is a bad page upon failing to decode the at least one page of data after read-retry operations based on all of the plurality of sets of threshold voltage configurations have been performed.

9. A method of reading data from a first memory to a second memory performed by a device, wherein the device includes a buffer and a processor connected to the buffer, the method comprising:
   reading at least one page of data from the first memory;
   generating a pre-detection result that indicates whether the at least one page is a blank page based a metadata block of the at least one page of data stored in the buffer, wherein the metadata block includes a first part for storing information for the at least one page, wherein the information indicates whether the at least one page is a bad page, and a second part for generating the pre-detection result, wherein the blank page pre-detection unit generates the pre-detection result by counting a number of 1s and 0s only in the second part and comparing the counted number of 1s and 0s with a predetermined threshold;
   generating a pre-detection-done signal in response to generating of the pre-detection result;
   in response to receiving the pre-detection-done signal in response to generating of the pre-detection result, performing blank page detection based on all of the data in the at least one page if the pre-detection result indicates that the at least one page is a blank page; and
   de-randomizing and decoding the at least one page of data to process all of the data in the at least one page to identify a type of the page if the pre-detection result or the blank page detection indicates that the at least one page is not a blank page, wherein the types of pages includes a programmed page and the bad page.

10. The method of claim 9, wherein the threshold is set as half of the number of bits in the non-occupied part.

11. The method of claim 9, further comprising storing the at least one page of data to the second memory.

12. The method of claim 9, wherein the at least one page of data is read from the first memory based on a set of threshold voltage configurations, wherein the set of threshold voltage configurations includes at least one threshold voltage configuration indicating a mapping between logic values and corresponding voltage ranges inside a single information storage cell of the first memory.

13. The method of claim 12, further comprising, upon a failure to decode the at least one page of data read based on a first set of threshold voltage configurations, performing a read-retry operation with a second set of threshold voltage configurations.

14. The method of claim 13, wherein the read-retry operation comprises:
reading the at least one page of data from the first memory based on the second set of threshold voltage configurations, and
de-randomizing and decoding the at least one page of data read based on the second set of threshold voltage configurations.

\* \* \* \* \*